United States Patent [19]

Aihara

[11] Patent Number: 4,881,205

[45] Date of Patent: Nov. 14, 1989

[54] COMPACT ELECTRONIC APPARATUS WITH A REFRESH UNIT FOR A DYNAMIC TYPE MEMORY

[75] Inventor: Toshiharu Aihara, Tokyo, Japan

[73] Assignee: Casio Computer Co., Ltd., Tokyo, Japan

[21] Appl. No.: 181,444

[22] Filed: Apr. 14, 1988

[30] Foreign Application Priority Data

Apr. 21, 1987 [JP] Japan .................................... 62-60166

[51] Int. Cl.$^4$ .................. G11C 7/00; G11C 8/00; G06F 1/00
[52] U.S. Cl. .................................... 365/222; 365/227; 365/233; 365/45; 364/707; 379/88
[58] Field of Search .............. 365/222, 233, 230, 227, 365/228, 45; 379/67, 88; 364/707

[56] References Cited

U.S. PATENT DOCUMENTS

| | | | |
|---|---|---|---|
| 3,922,526 | 11/1975 | Cochran | 364/707 |
| 4,005,395 | 1/1977 | Fosler, Jr. et al. | 365/222 |
| 4,217,637 | 8/1980 | Faulkner et al. | 364/200 |
| 4,317,181 | 2/1982 | Teza et al. | 364/707 |
| 4,556,952 | 12/1985 | Brewer et al. | 365/222 |
| 4,682,328 | 7/1987 | Ramsay et al. | 371/13 |
| 4,686,386 | 8/1987 | Tadao | 356/227 |
| 4,717,261 | 1/1988 | Kita et al. | 365/45 |

FOREIGN PATENT DOCUMENTS

| | | | |
|---|---|---|---|
| 0103426 | 6/1985 | Japan | 364/707 |
| 0237522 | 11/1985 | Japan | 364/707 |

Primary Examiner—Glenn A. Gossage
Attorney, Agent, or Firm—Frishauf, Holtz, Goodman & Woodward

[57] ABSTRACT

A compact electronic apparatus employs a dynamic type memory, e.g., a dynamic random access memory (DRAM), a crystal oscillator circuit for generating a high frequency signal, and a resistor/capacitor (RC) circuit for generating a low frequency signal. When the apparatus is operated, the high frequency signal is used for accessing the data stored in the DRAM. When operation of the apparatus is interrupted, the DRAM is refreshed by the low frequency signal thus reducing the entire power consumption of the apparatus, since the power consumption of the RC oscillator circuit is lower than that of the crystal oscillator circuit.

12 Claims, 6 Drawing Sheets

COMPACT ELECTRONIC APPARATUS WITH A REFRESH UNIT FOR A DYNAMIC TYPE MEMORY

BACKGROUND OF THE INVENTION

1. Field of the Invention

The present invention relates to a refreshing apparatus for a dynamic type memory, such as a dynamic random access memory (DRAM), which requires a refreshing control in order to hold data stored in dynamic storage cells.

2. Description of the Related Art

In general, dynamic type memories are comprised of memory cells arranged with MOS transistors. MOS transistor implemented memory cells are operated dynamically, and random access memories comprised of such memory cells are known as a "DRAM". A refreshing operation is required, in a predetermined time interval, for holding data stored in such memory cells of the DRAM.

Very recently, the memory integration capacity for DRAM is becoming higher and higher, i.e., 256 Kbits, 1 Mbits, 4 Mbits and 16 Mbits. Accordingly, utilization of such a higher-memory-capacity DRAM is expanded. For instance, there are handheld type compact electronic appliances employing the higher-memory-capacity DRAM, e.g., an electronic notebook capable of storing and displaying names and telephone numbers; an electronic scheduler capable of storing and displaying dates, times and schedules; and an electronic time table capable of storing and displaying departure times for a bus, a train and an airplane. Moreover, the higher-memory-capacity DRAM may be utilized in a voice recording/reproducing apparatus for recording/reproducing the voice information supplied externally by coding/decoding this voice information.

In the above-described compact electronic appliances employing such a higher-memory-capacity DRAM, the refreshing operation is continuously required for not only the data writing operation into DRAM and the data reading operation from DRAM, but also the data storage. This causes high power consumption in DRAM. More specifically, since these compact handy type electronic appliances are portable and thus a small-sized battery is employed as a power source, the power consumption is continuously effected by performing the refreshing operation even when the operation of the compact electronic appliances is interrupted, resulting in shortening the battery life. As a consequence, such a small-sized battery must be frequently replaced with a new battery.

SUMMARY OF THE INVENTION

The present invention has been accomplished by solving the above-described conventional drawbacks.

It is therefore an object of the invention to provide refreshing apparatus for a dynamic type memory where the power consumption of the refreshing operation during the nonoperating period of the dynamic type memory can be suppressed and thus, the battery life can be prolonged.

To achieve the above-described object of the invention, a refreshing apparatus for a dynamic type memory according to the invention comprises:

a battery power source;

first oscillator means for oscillating a relatively high frequency signal based upon a battery voltage applied from the battery power source;

second oscillator means for oscillating a relatively low frequency signal based upon the battery voltage applied from the battery power source, said low frequency signal being lower than said high frequency signal;

a dynamic type memory required to be refreshed during a non-access time period;

first control means for accessing said dynamic type memory in response to said relatively high frequency signal derived from said first oscillator means; and, second control means for interrupting the oscillation of said first oscillator means, and for refreshing said dynamic type memory in response to the low frequency signal derived from said second oscillator means.

With this arrangement, according to the invention, the power consumption occurring in the nonoperating period of the dynamic type memory can be considerably reduced, and the battery life can be prolonged even when the high-memory-capacity dynamic type memory is employed in a compact electronic appliance using a small-sized battery.

BRIEF DESCRIPTION OF THE DRAWINGS

The invention will now be described further by way of example only and with reference to the accompanying drawings, in which.

DETAILED DESCRIPTION OF THE PREFERRED EMBODIMENTS

Card-Shaped Recording/Reproducing Apparatus

Figure 1:
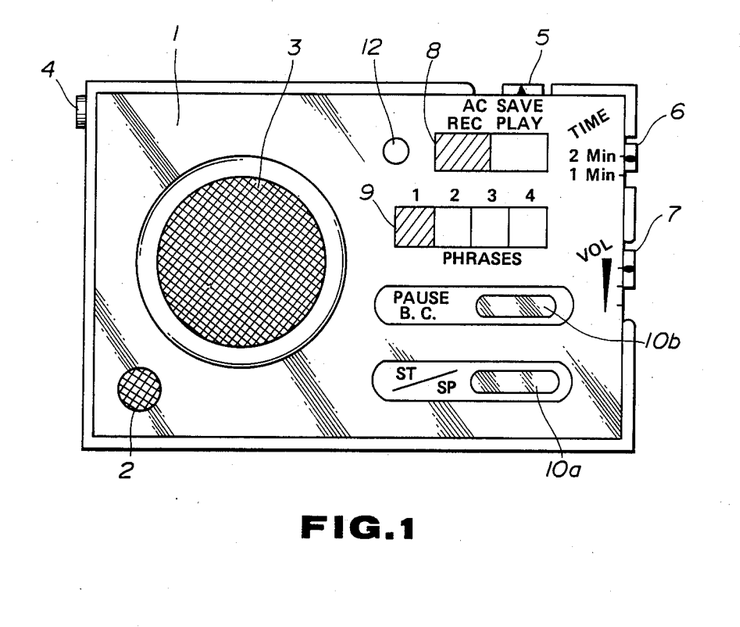
FIG. 1 illustrates an outer appearance of a recording/reproducing apparatus into which the present invention has been introduced.

In FIG. 1, there is shown a front view of the outer appearance of a card-shaped recording/reproducing apparatus into which the present invention has been employed. This recording/reproducing apparatus includes a body case 1 made of a synthetic resin. It further includes a microphone 2 for receiving acoustic sounds (voice) externally supplied and converting them into a sound signal which will then be supplied to an electronic circuit employed within the recording/reproducing apparatus. A speaker 3 is provided to produce a sound (voice) which has been recorded therein. An earphone jack 4 is employed in the recording/reproducing apparatus, by which the contents recorded therein can be also heard instead of using the speaker 3. Slide switches 5, 6 and 7 are arranged on a side surface of the body case 1. The slide switch 5 is constructed of a two-contact type switch. When the slide switch 5 is changed over to an AC (all clear) position, the power source for the entire electronic circuit is turned off. When the slide switch 5 is changed to a SAVE position, the power supply voltage is applied to a specific electronic circuit. The two-contact type slide switch 6 is to switch the recording time into 1 minute or 2 minutes. The three-contact type volume switch 7 is to change the reproduced sound volume into three stages. Slide switches 8 and 9 are positioned on a front surface of the body case 1. The first slide switch 8 is a two-contact type mode changing switch for the recording mode (REC) and reproducing mode (PLAY). The remaining slide switch 9 is a phrase selecting switch for selecting four recording contents. The recording/reproducing apparatus further employs self-recovery type push button switches "10a" and "10b". The push button switch 10a is a start/stop switch for controlling the start and stop operations of recording and reproducing a voice, whereas the push button switch 10b is a pause switch for temporarily stopping the recording operation, or reproducing operation. This push button switch 10b also functions as a battery check switch for checking a built-in battery independently of the recording operation, or reproducing operation. The recording/reproducing apparatus includes a light emitting diode (LED) 12 for indicating the recording operation and reproducing operation, and also battery voltage conditions. Although not shown in FIG. 1, a battery storing unit is employed on a rear side of the body case 1.

Entire Circuit of Recording/Reproducing Apparatus

Figure 2:
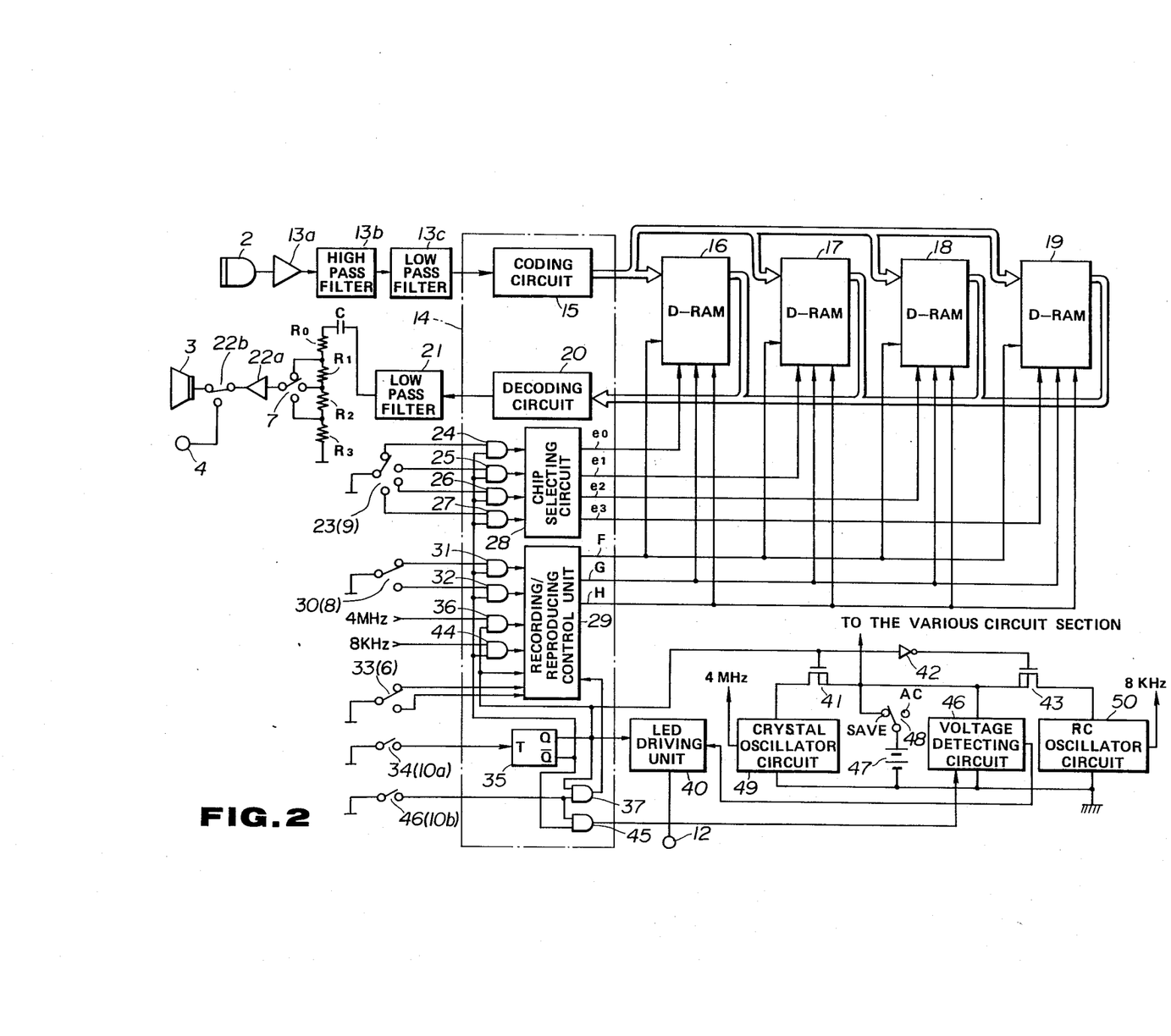
FIG. 2 is a circuit diagram of the recording/reproducing apparatus shown in FIG. 1.

FIG. 2 is a circuit diagram of a recording/reproducing circuit stored inside the body case 1 of the recording/reproducing apparatus.

It should be noted that the same or similar components as those shown in FIG. 1 are represented by the same reference numerals.

In the circuit of FIG. 2, an acoustic sound, or voice is converted by the microphone 2 into the voice signal. Then, the voice signal is amplified by an amplifier 13a, and thereafter the amplified voice signal is supplied via a high-pass filter 13b and a low-pass filter 13c to a coding circuit 15 in a control unit 14. The function of this coding circuit 15 is to code an input digital signal in, for instance, an ADPCM (Adaptive Differential Pulse Code Modulation) system after the analog voice signal derived from the low-pass filter 13c is converted into a corresponding digital signal. Thus, the coded voice code signal is written into a dynamic random access memory (D-RAM) 16, 17, 18, or 19 for the recording purpose. The detailed description of these dynamic RAMs 16, 17, 18 and 19 will be later discussed. The voice code signals recorded in the respective dynamic RAMs are sequentially read out therefrom in accordance with a recorded signal sequence, and thereafter supplied to a decoding circuit 20. In the decoding circuit 20, the voice code signal supplied is decoded into original digital data, and moreover converted into a corresponding analog signal. This analog signal is supplied to a low-pass filter 21. An analog signal derived from the low-pass filter 21 is supplied to a volume (sound intensity) control circuit constructed of a series connection of a capacitor C and resistors $R_0$ to $R_3$, so that from each of the terminals of the respective resistors $R_0$, $R_1$ and $R_2$, three analog signals having different voltages are output. One of these different analog signals is selected by a volume switch 7 and then supplied to an amplifier 22a. The selected analog signal is thereafter supplied to the speaker 3 via a switch unit 22b, from which a voice is produced. This switch unit 22b is of a switch to be actuated when an earphone (not shown) is inserted into the earphone jack 4. When the earphone is not inserted into the earphone jack 4, the above-described analog signal is supplied to the speaker 3. To the contrary, when the earphone is inserted into the earphone jack 4, this analog signal is supplied into an earphone jack 4 so that an operator can listen to a voice from the earphone.

A switch 23 is employed to change its switching contacts by means of the phrase selecting switch 9. The signals supplied via the respective switching contacts are supplied via AND gates 24, 25, 26 and 27 to a chip selecting circuit 28. Upon receipt of one of the signals derived from the AND gates 24, 25, 26, and 27, the chip selecting circuit 28 initializes each of the addresses of the dynamic RAMs 16, 17, 18 and 19 at each rising edge of the AND-gated signals. Thereafter, the chip selecting circuit 28 supplies chip enable signals $e_0$ to $e_3$ to these DRAMs. Consequently, only one dynamic RAM which has been selected by the phrase selecting switch, and into which the chip enable signal has been supplied, is brought into the recording/reproducing conditions.

A switch 30 is provided, the switching contacts of which are changed over by the mode changing switch 8. The signal supplied via one contact is supplied via an AND circuit 31, as a recording mode signal, to a recording/reproducing control unit 29, whereas the signal supplied via the other contact is supplied via an AND circuit 32, as a reproducing mode signal, to the recording/reproducing control unit 29. A switch 33 changes its contacts to select the recording time in response to the switching operation of the switch 6. The signals supplied via the respective contacts are supplied to the recording/reproducing unit 29.

A switch 34 is turned on/off by operating the start/stop switch 10a, and is a self-recovery type switch which is turned on while being depressed by a finger and other proper tools, as previously described. Accordingly, this self-recovery type switch is turned off when such a finger depression is removed. The operation signal produced by this self-recovery type switch 34 is supplied to an input terminal T of a binary flip-flop 35 which causes the output signals derived from the output terminals Q and $\bar{Q}$ to be reversed. The output signal derived from the output terminal Q of the binary flip-flop 35 is supplied, as a command signal for the recording and reproducing operations, to the recording/reproducing control unit 29. Similarly, this output signal is supplied to AND circuits 36 and 37, and furthermore, via an LED driver unit 40 for driving LED 12, a transistor 41 and, via an inverter 42, to a transistor 43. The output signal derived from the output terminal $\bar{Q}$ of the binary flip-flop 35 is, on the other hand, supplied to the above-described AND gates 24 to 27, 31 and 32, and also to the AND gates 44 and 45. A switch contact 46 is turned on/off by means of the push button switch 10b, and the switch operation signal of this switch contact 46 is supplied to the AND gates 37 and 45. The output signal derived from the AND gate 37 is supplied to the recording/reproducing unit 29 as a temporary stop signal of the recording and reproducing operations. This implies that while the output signal is derived from the AND gate 37, the recording or reproducing operation is temporarily stopped. Also, the output signal derived from the AND gate 45 is supplied as an operation command signal to a voltage detecting circuit 46. This voltage detecting circuit 46 detects the voltage of the battery 47 upon receipt of the above-described operation command signal. When the detected voltage exceeds a voltage capable of driving satisfactorily the various circuit sections, as illustrated in FIG. 2, this voltage detecting circuit 46 produces the signal capable of driving LED 12, and supplies this signal to the LED driving unit 40.

The output voltage of the battery 47 is applied to the switch 48, the switch contacts of which are changed over by the power switch 5. This switch 48 is operated as follows. That is, only when the power switch 5 is changed over to the SAVE side, the battery voltage is applied to the various circuit sections, and also via the transistor 41 or 43 to a crystal oscillator circuit 49 from which a 4 M (mega) Hz oscillator signal is generated, or to a RC oscillator circuit 50 from which a 8 KHz oscillator signal is generated.

The 4 MHz oscillator signal generated from the crystal oscillator circuit 49 is used for processing the information in the coding circuit 15 and decoding circuit 20, and is supplied via the AND gate 36 to the recording-/reproducing unit 29. The 8 KHz oscillator signal generated from the CR oscillator circuit 49 is supplied via the AND gate 44 to the recording/reproducing unit 29.

Circuit of Recording/Reproducing Control Unit

Figure 3:
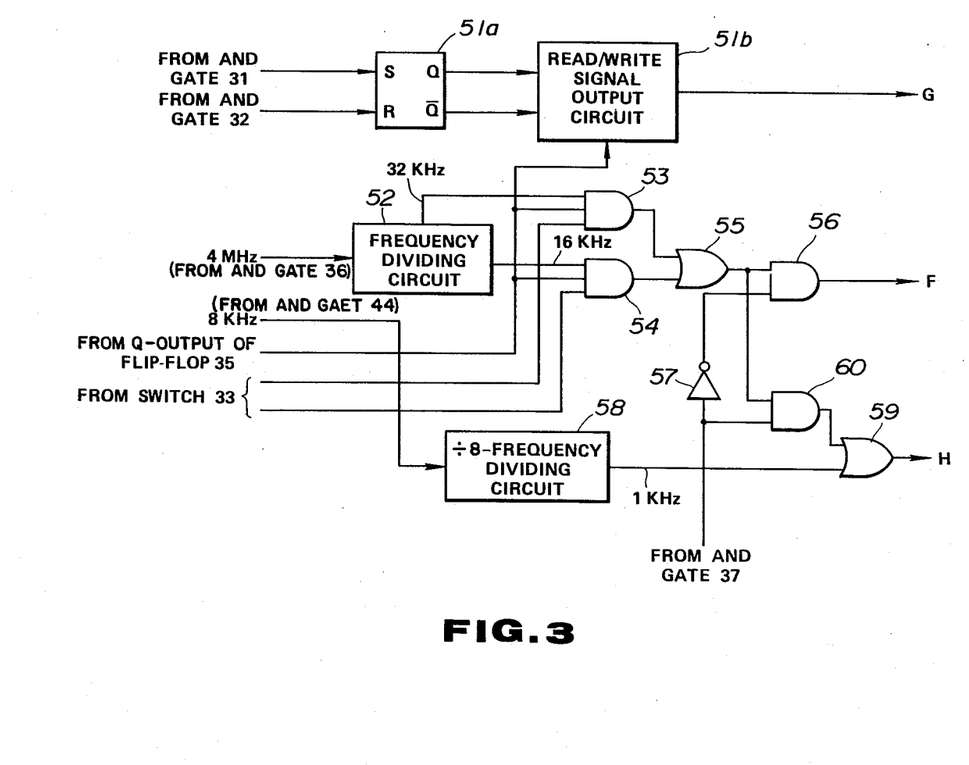
FIG. 3 is a detailed circuit arrangement of the recording/reproducing control unit 29 illustrated in FIG. 2.

In FIG. 3, there is shown a detailed circuit arrangement of the recording/reproducing control unit 29.

A flip-flop 51a is employed which is set by receiving the output signal from the AND gate 31, and is reset by receiving the output signal from the AND gate 32. These set and reset signals from the flip-flop 51a are supplied to a read/write signal output circuit 51b. In response to the Q output signal from the binary flip-flop 35, the read/write output circuit 51b is actuated to output the write signal while the set signal from the above-described flip-flop 51a is supplied, and to output the read signal while the reset signal from flip-flop 51a is supplied to the read/write output circuit 51b.

A frequency dividing circuit 52 is employed to frequency-divide the 4 MHz oscillator signal output from the AND gate 36, into a 32 KHz oscillator signal and a 16 KHz oscillator signal. The 32 KHz oscillator signal and 16 KHz oscillator signal are input to the respective AND gates 53 and 54.

To the AND gate 53, both the Q output signal from the flip-flop 35 and one output signal from the switch 33 are supplied. The latter output signal corresponds to a signal which is produced when the recording time is selected to be 1 minute by means of the slide switch 6. To the AND gate 54, both the Q output signal from the flip-flop 35 and the other output signal from the switch 33 are supplied. The other output signal of switch 33 corresponds to a signal which is produced when the recording time is selected to be 2 minutes by means of the slide switch 6. Both the output signals derived from the AND gates 53 and 54 are supplied, as a sampling signal "F", via the OR gate 55 AND gate 56 to DRAMs 16 through 19. It should be noted that the signal output from the AND gate 37 is supplied via the inverter 57 to the AND gate 56. Thereafter, the 8 KHz oscillator signal supplied from the AND gate 44 is frequency-divided by a ÷8-frequency divider circuit 58 into a 1 KHz oscillator signal, which is supplied, via OR gate 59 to DRAM's 16 through 19 as a refresh signal.

Both the output signals derived from the OR gate 55 and from the AND gate 37 are supplied to AND gate 60. The output signal from AND gate 60 is supplied to the OR gate 59.

Internal Circuit of Dram 16

Figure 4:
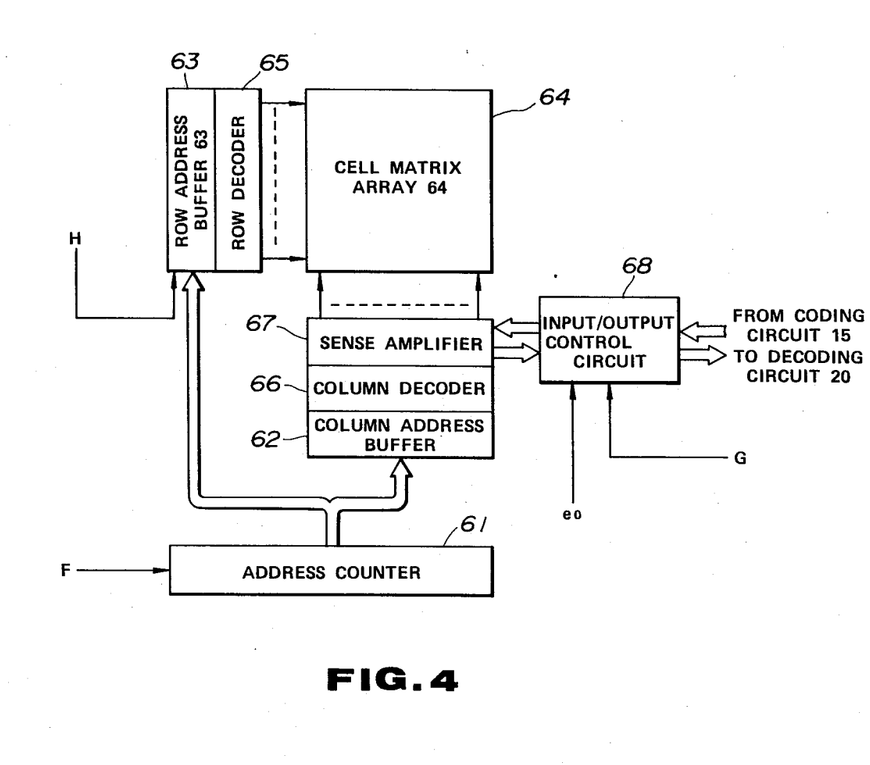
FIG. 4 is a detailed circuit diagram of DRAM (dynamic random access memory) 16 shown in FIG. 2.

Referring now to FIG. 4, an internal circuit of DRAM 16 will be described.

The sampling signal "F" supplied from the recording/reproducing control unit 29 is counted by an address counter 61. The count value of the address counter 61 is supplied to a column address buffer 62 and also to a row address buffer 63. Every time the address counter 61 is sequentially counted, memory regions of a storage cell matrix array 64 are sequentially addressed from the first address to the last address. In other words, the memory contents of the row address buffer 63 are sequentially decoded by a row decoder 65 so that the line of the storage cell matrix array 64 constructed of MOS transistors for storing the data is designated. The memory contents of the column address buffer 62 are decoded by a column decoder 66 so that the column of the storage cell matrix array 64 is designated via a sense amplifier 67, and the data writing/reading operation is carried out via an input/output control circuit 68 by the sense amplifier 67. Accordingly, to this end, a read/write signal "G" and a chip enable signal "$e_0$" are furnished to this input/output control circuit 68.

Data signals supplied to the memory cell matrix array 64 via the input/output control circuit 68 are stored on parasitic capacitances between the gate and source terminals of the MOS transistors of the memory cell matrix array 64. The stored data signal is not accessed over a predetermined amount of time, and the charge on the capacitor decreases as a result of leakage currents.

A refresh signal "H" supplied from the recording/reproducing control unit 29 is supplied to the row address buffer 63.

The row address buffer 63 supplies a refresh operating signal to the memory cell matrix array 64 via the row decoder 65.

It should be also noted that although not shown in FIG. 4, the circuit arrangements of the remaining DRAMs 17 to 19 are the same as that of the above-described DRAM 16. There is, however, a difference such that enable signals "$e_1$", "$e_2$" and "$e_3$" are employed instead of the previous enable signal "$e_0$".

Voice Data Recording/Reproducing

When neither recording operation, nor reproducing operation of the voice data is carried out, or when the storage of the recorded contents are not required, the power switch 5 is changed into the AC side. As a result, no voltage from the battery 47 is applied to the corresponding circuit sections, so that it can prevent unnecessary power consumption. When the recording/reproducing operation is performed, the power switch 5 (the switch 48 shown in FIG. 2) is changed to the "SAVE" side. Operating the phrase selecting switch 9 (the switch 23 shown in FIG. 2) enables one of the first to fourth phrases, for instance, DRAM 16 to be selected. Consequently, one of these DRAMs 16 to 19 can be accessed. After the mode changing switch 8 (the switch 30 shown in FIG. 2) is changed over to the "recording" side (the AND gate 31 illustrated in FIG. 2), the start/stop switch 10a (the switch 34 shown in FIG. 2) is manuplated so as to set the binary flip-flop 35. Since the Q output signal of this binary flip-flop 35 causes the transistor 41 to be turned on, the voltage from the battery 47 is applied to the crystal oscillator circuit 49. Then, the crystal oscillator circuit 49 starts its oscillation to send the 4 MHz oscillator signal via the AND gate 36 to the recording/reproducing control unit 29. In the recording/reproducing control unit 29, the Q output signal from the binary flip-flop 35 is supplied via the AND gate 31 thereto, the read/write signal G supplied from the read/write control signal output circuit 51b of the recording/reproducing control unit 29 is derived as the read signal. The 32 KHz sampling pulse "F" is output when 1-minute recording time is selected by means of the recording time selecting switch 6 (the switch 33 shown in FIG. 2), whereas the 16 KHz sampling pulse "F" is output when 2-minute recording time is selected by means of the recording time selecting switch 6. These sampling pulses are produced in such a manner that the 4 MHz signal input via the AND gate 36 from the crystal oscillator circuit 49 is frequency-divided into the 32 KHz sampling pulse and 16 KHz sampling pulse by the frequency dividing circuit 52, and either proper sampling pulse is selected to be used. During the recording operation, LED 12 is turned on by supplying the Q output signal of the binary flip-flop 35 to the LED driving unit 40.

In DRAM 16, either 32 KHz or 16 KHz sampling pulse "F" is counted in the address counter 61. The counting result of the address counter 60 is transferred to both the row address buffer 63 and column address buffer 62 so as to sequentially address the cell array 64 from the first memory region to the last memory region. As a consequence, the voice input into the microphone 2 is coded in the coding circuit 15, and thereafter the coded voice data signals are sequentially written via the input/output control circuit 68 of DRAM 16 into the cell array 64 for the voice data storage.

The recording/reproducing operation of the voice data will now be summarized.

In response to the write signal "G" and the sampling pulse "F" derived from the recording control unit 29, the voice input into the microphone 2 is converted into the corresponding voice data and then, the voice data is written into the DRAM which has been selected by means of the phrase selecting switch 9.

When the recorded voice data is reproduced, the mode selecting switch 8 is changed to the reproducing side and the binary flip-flop 35 is set by operating the start/stop switch 10a. When the mode selecting switch 8 is changed to the reproducing side, the read/write signal "G" supplied from the read/write control signal output circuit 51b becomes the read signal. The sampling pulse "F" is output put the same as in the recording operation. The voice code which has been recorded in DRAM, is read out from the first address region thereof, and reproduced from the speaker 3.

It should be noted that while the pause switch 10b (the switch 46 in FIG. 2) is operated, the supply of the sampling pulse "F" from the AND gate 56 is temporarily stopped because of no output from the inverter 48, so that the recording operation, or reproducing operation is temporarily stopped. While recording or reproducing operation is stopped, the output signal from AND gate 60 is supplied, via the OR gate 59, to the row address buffer 63 so as to perform the desired memory refreshing operation.

No Recording/Reproducing Operation

When no recording/reproducing operation is carried out, i.e., when the $\overline{Q}$ output ($\overline{Q}=1$) is derived from the binary flip-flop 35, the following operation is performed.

First, since there is no Q output from the binary flip-flop 35, the transistor 41 is turned off. Instead of interrupting the supply of the battery voltage to the crystal oscillator circuit 49 so as to stop the on-operation of the transistor 41, the transistor 43 is turned on by receiving the output from the inverter 42. Accordingly, the voltage of the battery 47 is applied to the CR oscillator 50. The 8 KHz oscillator signal is output from the CR oscillator 50, and transferred via the AND gate 44, the gate of which has been opened by receiving the $\overline{Q}$ output from the binary flip-flop 35, to the recording/reproducing control unit 29. This 8 KHz oscillator signal is frequency-divided in the $2^3$-frequency dividing circuit 58 of the recording/reproducing control unit 29 into the 1 KHz oscillator signal. This 1 KHz oscillator signal is supplied as the refresh signal "H" to the respective DRAMs 16 to 19.

This is the reason why such a refresh signal "H" is produced by way of the CR oscillator 50, instead of frequency-dividing the 4 MHz oscillator signal derived from the crystal oscillator circuit 49. That is to say, although it may be possible to produce the refresh signal "H" for maintaining the memory contents of DRAM by frequency-dividing the 4 MHz signal from the crystal oscillator circuit 49, the lower frequency oscillator signal of the RC oscillator 50 relative to that of the crystal oscillator circuit 49 is used to produce the refresh signal. Since the crystal oscillator circuit 49 which consumes higher power is brought into the inactive condition, the resultant power consumption can be lowered.

Then, the refresh signal "H" is supplied to the row address buffer 63 so as to perform the memory refreshing operation.

When the $\overline{Q}$ output is supplied from the flip-flop 35, the output can be derived from the AND gate 45 by operating the pause switch 10b and then, the voltage check can be performed by the voltage detecting circuit 46.

Electronic Notebook

In the previous preferred embodiment as illustrated in FIGS. 1 through 4, since the voice is recording/reproduced, the writing/reading operations of the voice data into/from DRAMs is performed in such a way that the initial addresses of DRAMs are sequentially designated by employing the sampling signal.

In contrast, in case of an electronic notebook and an electronic scheduler, etc., a keyboard for entering data and a controller such as a CPU (central processing unit) are employed, a DRAM (dynamic random access memory) is addressed under control of the CPU, and the data is written into a memory region which has been addressed. Similar processing occurs when the data stored in DRAM is addressed.

According to the invention, the refreshing operation of the dynamic memory can be adapted similarly to an electronic appliance where the addresses of DRAM are arbitrarily designated so as to access the DRAM. For instance, an electronic notebook into which the refreshing operation of the invention has been applied, will now be described with reference to FIG. 5.

Figure 5:
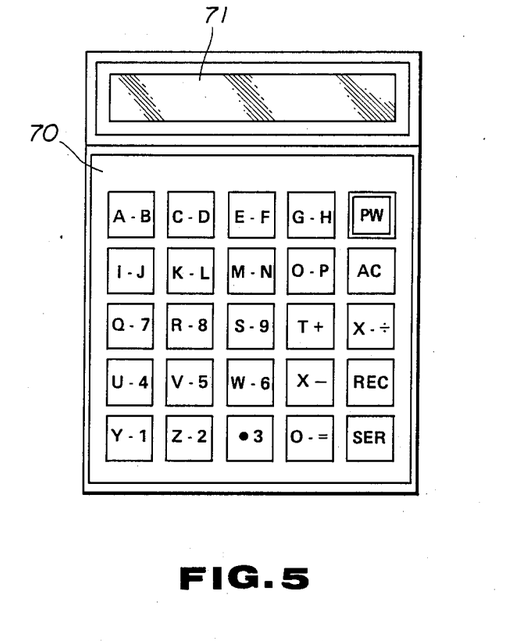
FIG. 5 illustrates an outer appearance of an electronic notebook according to another preferred embodiment; and, FIG. 6 is a circuit diagram of the electronic notebook shown in FIG. 5.

The electronic notebook, as illustrated in FIG. 5, employs a keyboard unit 70. The keyboard unit 70 includes various entry keys for entering an alphabet and numerical data; a record key ("REC" key) for storing the entered data into a DRAM (dynamic random access memory; will be discussed later); a search key ("SER"

key) for reading the data stored in the DRAM, a power key ("PW" key) operated when the electronic notebook is powered; a clear key ("AC" key) for clarifying the entered data, and so on. The electronic notebook further employs a liquid crystal display unit for displaying the entered alphabet, numerical data and the data read out from DRAM.

When the power key is depressed, the voltage of the battery is applied to an electronic circuit (which will be described later), and simultaneously the liquid crystal display unit 71 is brought into the display condition.

Under this display condition, a name is entered by use of the alphabet keys and a telephone number is entered by way of the numerical keys. Then, these entered data are displayed on the display unit 71 and the key-entered name and telephone number are stored in the DRAM by manipulating the REC key. By repeating such a data entry, a large quantity of names and telephone numbers are stored into this DRAM.

When the data stored into the DRAM is read out, only a heading character of the name, or the full name is entered and the SER key is operated. In response to the key operation of this SER key, CPU reads the data, i.e., the name and telephone number in question, which are coincident with those from a large quantity of a person's data previously stored in the DRAM. The coincident data are then displayed on the display unit 71.

The electronic notebook having the above-described specific functions, is per se known in the art, for instance, U.S. Pat. No. 4,117,542. When no key entry is carried out for a predetermined time period, e.g., 5 minutes, the data displayed on the display unit 71 disappears, and the supply of the battery voltage to the various electronic circuits is interrupted. Such a power supply interruption is so-called as an "auto-power-off function" by which the power supply is automatically turned off when no key entry condition is continued for a predetermined time period. This auto-power-off function is generally known in the art. The electronic notebook as illustrated in FIG. 5 employs the above-described conventional various functions.

Circuit of Electronic Notebook

Figure 6:
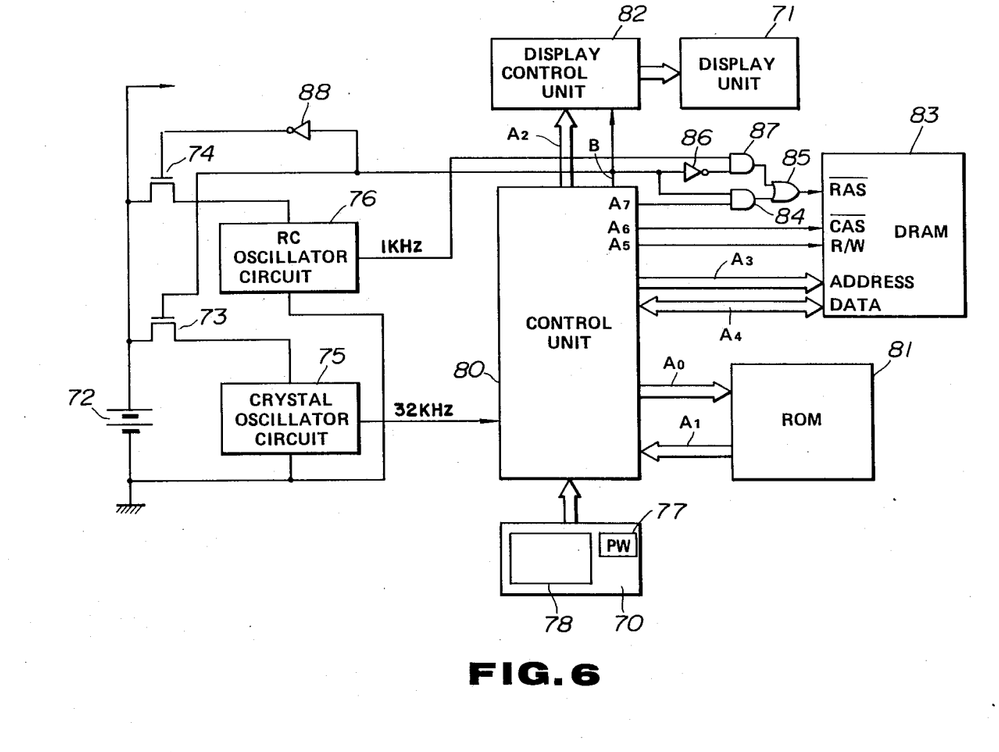

In a circuit diagram of the electronic notebook shown in FIG. 6, a battery power supply 72 is employed. This battery voltage is applied via a transistor 73 and a transistor 74 to a crystal oscillator circuit 75 and a CR oscillator circuit 76, respectively, and other circuit sections (which will be discussed later). The crystal oscillator circuit 75 produces a 32 KHz oscillating frequency signal, whereas the CR oscillator circuit 76 produces a 1 KHz oscillating frequency signal. The keyboard unit 70 is arranged by a power key ("PW" key) 77 and other keys 78. A key operation signal of this keyboard unit 70 is transferred together with the 32 KHz oscillating frequency signal derived from the crystal oscillator circuit 75, to a control unit 80 constructed of a CPU and so on.

The control unit 80 has a first function for controlling the read/write operations of the key-entered data into DRAM, and a second function for controlling the above-described auto-power-off operation. The control unit 80 performs these functions under control of the microprogram which has been stored in ROM (read only memory) 81. To this end, an address data "$A_0$" is sent to ROM 81 from this control unit 80 and a microprogram data "$A_1$" is received from ROM 81.

Under control of the control unit 80, a data "$A_2$" to be displayed on the display unit 71 is output to the display control unit 82 and displayed on the display unit 71.

This electronic notebook further employs a DRAM (dynamic random access memory) 83, which is addressed by an address signal "$A_3$". The data is input-/output into/from this DRAM 83 by use of a data signal "$A_4$".

A read/write signal "$A_5$" (R/W) and a column address strobe signal "$A_6$" ($\overline{CAS}$) are supplied from the control unit 80 to this DRAM 83, and a row address strobe signal "$A_7$" is supplied via an AND gate 84 and an OR gate 85 to DRAM 83 similarly.

A signal denoted by "B" is a BUSY signal output from the control unit 80. This BUSY signal becomes a high level by operating the power switch 77 of the above-described keyboard unit 70. This BUSY signal becomes a low level when no key operation of the keyboard unit is continued for a predetermined time period by means of the above-described auto-power-off function. Then, this BUSY signal "B" is input into the above-described AND gate 84, and transferred via an inverter 86 to another AND gate 87 into which the 1 KHz oscillating frequency signal from the CR oscillator circuit 76 has been input. Also, the BUSY signal "B" is supplied to the display control unit 82 as a display instruction signal, and is supplied to a gate electrode of the transistor 73 as a turn-on signal. Moreover, this BUSY signal "B" is transferred to a gate electrode of the transistor 74 via the inverter 88.

Data Writing/Reading Operations

When the power switch 77 is turned on, the BUSY signal "B" derived from the control unit 80 becomes a high level signal. As a consequence, the transistor 73 is turned on, to which this BUSY signal "B" has been supplied, so that the voltage of the battery 72 is applied to the crystal oscillator circuit 75. The 32 KHz oscillating frequency signal is supplied from the crystal oscillator circuit 75 to the control unit 80.

Based upon the 32 KHz oscillating frequency signal sent from the crystal oscillator circuit 75, the control unit 80 performs the reading/writing operations of the data into/from DRAM 83. The control unit 80 transfers the read/write signal "$A_5$", column address strobe signal "$A_6$", row address strobe signal "$A_7$" to DRAM 83 together with the address data "$A_3$" and data signal "$A_4$". The data read from DRAM 83 are sent to the display control unit 82 and then displayed on the display unit 71.

When the operation of the electronic notebook is completed, and the BUSY signal "B" becomes a low level, the transistor 73 is turned off and the supply of the battery voltage to the crystal oscillator circuit 75 is interrupted so that the oscillation of the 32 KHz oscillating frequency signal is stopped. The transistor 74 is, on the other hand, turned on by the output from the inverter 88. Then, the CR oscillator circuit 76 outputs the 1 KHz oscillating frequency signal to the AND gate 87. Since the BUSY signal "B" is now a low level signal, the row strobe signal "$A_7$" derived from the control unit 80 is not output from the AND gate 84, and the 1 KHz oscillating frequency signal from the AND gate 87 is supplied via the OR gate 85 to DRAM 83.

As a result, the data stored in DRAM 83 can be refreshed by employing this 1 KHz oscillating frequency signal $\overline{RAS}$.

In summary, while the electronic notebook according to the preferred embodiment of the invention is operated, the crystal oscillator circuit 75 is energized so as to access the DRAM 83 by utilizing the higher oscillating frequency signal. Conversely, when the operation of the electronic notebook is interrupted, the crystal oscillator circuit 75 is brought into the inoperative condition and instead of this crystal oscillator circuit, the CR oscillator circuit 76, the oscillating frequency of which is lower than that of the crystal oscillator circuit 75, is energized so as to refresh this DRAM. As a result, the power consumption by the crystal oscillator circuit 75 can be lowered, and furthermore, the data storage during the refreshing operation in the DRAM can be performed with the lower power consumption because only the CR oscillator circuit 76 is energized when refreshing this DRAM.

In the above-described preferred embodiment, the auto-power-off function is equipped with the electronic notebook and the oscillation of the crystal oscillator circuit is continued only during the operation of the electronic notebook. The crystal oscillator circuit is energized only when the DRAM is accessed. In this case, the operations of the control unit and display unit may be controlled by way of the lower oscillating frequency signal from the CR oscillator circuit.

In addition, although the crystal oscillator circuit is employed so as to access the DRAM in the preferred embodiment, other oscillator circuits may be similarly employed as an oscillator for accessing DRAM. Moreover, instead of the CR oscillator circuit, any type of oscillator may be utilized.

What is claimed is:

1. A compact electronic apparatus having a refresh unit for a dynamic type memory, comprising:
   a battery power source;
   first oscillator means for generating a relatively high frequency signal;
   second oscillator means for generating a relatively low frequency signal with respect to said high frequency signal;
   a dynamic type memory required to be refreshed during a non-access time period;
   first switch means coupled between said battery power source and said first oscillator means, for applying a battery voltage derived from said battery power source to said first oscillator means;
   second switch means coupled between said battery power source and said second oscillator means, for applying the battery voltage obtained from said battery power source to said second oscillator means;
   external operation switch means for starting an accessing operation of said dynamic type memory;
   first output control means for actuating said first oscillator means, including means for applying said battery voltage to said first oscillator means when said first switch means is turned ON by operation of said external operation switch means, wherein said high frequency signal is generated;
   memory access means for accessing said dynamic type memory in response to said high frequency signal derived from said first oscillator means; and
   second output control means for turning OFF said first switch means during a non-accessing operation time period of said dynamic type memory and interrupting the oscillation of said first oscillator means, and for simultaneously turning ON said second switch means to actuate said second oscillator means, wherein said low frequency signal derived from said second oscillator means is output in the form of a refresh signal for said dynamic type memory.

2. A compact electronic apparatus claimed in claim 1, wherein said first oscillator means is a crystal oscillator circuit.

3. A compact electronic apparatus as claimed in claim 1, wherein said second oscillator means is a resistor and capacitor oscillator circuit.

4. A compact electronic apparatus as claimed in claim 1, wherein said dynamic type memory is a dynamic random access memory.

5. A compact electronic apparatus having a refresh unit for a dynamic type memory, comprising:
   a battery power source;
   first oscillator means for generating a relatively high frequency signal;
   second oscillator means for generating a relatively low frequency signal with respect to said high frequency signal;
   first switch means coupled between said battery power source and said first oscillator means, for applying a battery voltage derived from said battery power source to said first oscillator means;
   second switch means coupled between said battery power source and said second oscillator means, for applying the battery voltage obtained from said battery power source to said second oscillator means;
   first converting means for converting an externally provided voice sound into voice data;
   a dynamic memory coupled to said first converting means for storing said voice data therein, said memory being required to be refreshed for holding the stored voice data;
   write control means coupled to said first converting means, for enabling the storing of said voice data in said dynamic memory;
   second converting means coupled to said dynamic memory for converting said voice data stored in said dynamic memory into a voice signal;
   voice reproducing means coupled to said second converting means for reproducing said voice signal to generate a voice sound;
   externally operative switch means coupled to the dynamic memory for enabling writing and reading of said voice data;
   first control means coupled to said externally operative switch means for turning ON said first switch means to output said high frequency signal from said first oscillator means, and for storing said voice data by accessing said dynamic memory in response to said relatively high frequency derived from said first oscillator means; and
   second control means coupled to said externally operative switch means for turning OFF said first switch means and interrupting the oscillation of said first oscillator means, and for holding the stored voice data by refreshing said dynamic memory in response to the low frequency signal derived from said second oscillator means.

6. A compact electronic apparatus as claimed in claim 5, wherein said first oscillator means is a crystal oscillator circuit.

7. A compact electronic apparatus as claimed in claim 5, wherein said second oscillator means is a resistor and capacitor oscillator circuit.

8. A compact electronic apparatus as claimed in claim 5, wherein said dynamic memory is a dynamic random access memory.

9. A compact electronic apparatus having a refresh unit for a dynamic type memory, comprising:
- a battery power source;
- first oscillator means for generating a relatively high frequency signal;
- second oscillator means for generating a relatively low frequency signal with respect to said high frequency signal;
- first switch means coupled between said battery power source and said first oscillator means, for applying a battery voltage derived from said battery power source to said first oscillator means;
- second switch means coupled between said battery power source and said second oscillator means, for applying the battery voltage obtained from said battery power source to said second oscillator means;
- data input means including entry keys for entering at least numerical data;
- a dynamic memory coupled to said data input means for storing said numerical data entered by said data input means;
- first control means coupled to the dynamic memory, said first switch means and said data input means, for turning ON said first switch means to output said high frequency signal from said first oscillator means, and for accessing said dynamic memory in response to said high frequency signal derived from said first oscillator means; and
- second control means coupled to the dynamic memory and the first switch means for turning OFF said first switch means and interrupting the oscillation of said first oscillator means, and for refreshing said dynamic memory in response to the low frequency signal derived from said second oscillator means.

10. A compact electronic apparatus as claimed in claim 9, wherein said first oscillator means is a crystal oscillator circuit.

11. A compact electronic apparatus as claimed in claim 9, wherein said second oscillator means is a resistor and capacitor oscillator circuit.

12. A compact electronic apparatus as claimed in claim 9, wherein said dynamic memory is a dynamic random access memory.

* * * * *